(12) United States Patent
Gray

(10) Patent No.: US 6,573,783 B2
(45) Date of Patent: Jun. 3, 2003

(54) METHOD AND APPARATUS FOR OPEN-LOOP INPUT OFFSET ADJUSTMENT IN A DIFFERENTIAL AMPLIFIER

(75) Inventor: Jeromy R. Gray, Salt Lake City, UT (US)

(73) Assignee: National Semiconductor Corporation, Santa Clara, CA (US)

( * ) Notice: Subject to any disclaimer, the term of this patent is extended or adjusted under 35 U.S.C. 154(b) by 56 days.

(21) Appl. No.: 09/792,281

(22) Filed: Feb. 23, 2001

(65) Prior Publication Data
US 2002/0118064 A1 Aug. 29, 2002

(51) Int. Cl.[7] .................................................. H03F 3/45
(52) U.S. Cl. ................................................ 330/9; 330/253
(58) Field of Search ........................ 330/9, 253, 258, 330/259; 327/307

(56) References Cited

U.S. PATENT DOCUMENTS 6,194,962 B1 * 2/2001 Chen ............................. 330/9

OTHER PUBLICATIONS

"8–BIT MCU with 8K FLAHS, ADC, WDG, SPI, SCI, Timers SPGAs (Software Programmable Gain Amplifiers), OP–AMP", *ST72C171*, pp. 1; 38–40, 102–104; 119; 139; and 141–142, May 2000.

"8–bit CMOS Flash Micorcontroller with 8k Memory, Dual Op Amps, Virutal EEPROM, Temperature Sensor, 10–bit A/D and Brownout", *Data Sheet COP8AME9/COP8ANE9*, National Semiconductor Corporation, pp. 1–84, Feb. 2001.

* cited by examiner

Primary Examiner—Steven J. Mottola
(74) Attorney, Agent, or Firm—Merchant & Gould; John W. Branch

(57) ABSTRACT

An open loop offset trim system for use with a differential amplifier includes a reference generator, an offset detector and a trim circuit. To reduce offset, the differential amplifier is placed in an open loop configuration, with both input terminals connected to receive a common reference signal from the reference generator. In response to an offset, the differential amplifier's output signal will essentially rail to either the supply voltage or the ground. In response to the logic level of the differential amplifier's output signal, the offset detector provides a control signal to the trim circuit to adjust the current conducted by one leg of the differential pair to reduce current mismatch in the legs of the differential pair. This process may be performed iteratively to control the trim circuit to incrementally adjust the current conducted by a leg of the differential pair during the trimming process.

22 Claims, 9 Drawing Sheets

METHOD AND APPARATUS FOR OPEN-LOOP INPUT OFFSET ADJUSTMENT IN A DIFFERENTIAL AMPLIFIER

RELATED APPLICATIONS

The present application is related to pending U.S. patent application entitled "MOS Differential Amplifier with Offset Compensation", application Ser. No. 09/669,399 filed Sep. 22, 2000.

FIELD OF THE INVENTION

The present invention relates to differential amplifiers and, more particularly, to offset adjustment in differential amplifiers.

BACKGROUND

MOS integrated circuit differential amplifiers typically include a pair of source-coupled transistors with current sources connected to the drains of the source-coupled pair. Ideally, the sizes of the devices forming the differential amplifier (including the current sources) would be perfectly matched (i.e., identical in size, performance, etc.). However, in practice, the devices are not perfectly matched, resulting in an input offset. In many applications, this offset is undesirable. Further, the offset may change over time and environmental conditions. Therefore, in some applications, the offset of an amplifier is designed to be trimmable while in the application.

Conventional techniques to reduce input offset include performing an A/D conversion of the amplifier output when the same input signal is provided to both the positive input terminal of the amplifier and the input terminal of the gain network. The digital measurement represents the offset, which is then stored. During operation, the stored "offset" is then subtracted from the A/D converted output to cancel the offset. One disadvantage of this technique is that it relies on the accuracy of the A/D conversion. Another disadvantage is that to generate an offset-compensated analog output from the amplifier, a D/A converter must be used, which will add additional error to the amplifier circuit output signal. Further, the A/D/A conversion, in effect, delays the amplifier's output signal. In a digital system, the D/A "re-conversion" is not necessary, but the subtraction of the offset will add delay, which is undesirable in many applications.

Another conventional solution is autozeroing in which the autozero circuit measures the offset and stores a corresponding voltage on a capacitor. The capacitor is then switched inline with the input signal to cancel the offset. However, the capacitor can be undesirably large, especially in low speed applications, to reduce capacitor voltage decay. In addition, the autozero circuit requires switching and refresh circuitry, further increasing the size and complexity of the autozero circuit.

SUMMARY

In accordance with aspects of the present invention, a system to adjust the offset of a differential amplifier is provided for a variety of applications (e.g., a comparator, bandgap voltage reference, operational amplifier, etc.). In one aspect of the present invention, the system includes an offset detector, a reference generator, and a trim circuit, which are connected to the differential amplifier. In one embodiment, the differential amplifier has a standard MOS differential pair implementation.

In accordance with this aspect, during an offset trimming operation, the differential amplifier is placed in an open loop configuration, with both input terminals connected to receive a common reference signal from the reference generator. If the differential amplifier has an offset, the differential amplifier's output signal will essentially rail to either the supply voltage level or the ground level. In response to the logic level of the differential amplifier's output signal, the offset detector provides a control signal to the trim circuit to adjust the current conducted by one leg of the differential pair to reduce current mismatch in the legs of the differential pair, thereby reducing the offset.

During normal operation, the differential amplifier is isolated from the offset detector, the reference generator, and the trim circuit. By matching the differential pair currents without the use of a relatively large autozeroing capacitor, this aspect of the invention allows the system to be relatively area-efficient while avoiding analog-to-digital conversion during normal operation (unlike the conventional systems described above). Still further, this open loop system advantageously allows the trimming circuitry to be isolated from the gain network of the amplifier. In contrast, the previously described conventional solutions are performed closed loop, which tends to place the trimming circuitry in the gain network of the amplifier, which in turn can cause inaccuracy in the gain.

In a further refinement of this aspect, this process may be performed iteratively to control the trim circuit to incrementally adjust the current conducted by a leg of the differential pair during the trimming process. In this way, the offset may be reduced to within range corresponding to an increment. In one embodiment, the trim circuit includes two sets of trim transistors, one set being connected in parallel with one transistor of the differential pair, and the other set being connected in parallel with the other transistor of the differential pair. In this embodiment, each set's transistors have binary-weighted sizes (i.e., with the sizes being 1X, 2X, 4X, 8X and so on). Depending on the polarity of the offset, transistors in one of the sets are selectively enabled to incrementally increase the current conducted by the corresponding leg of the differential pair during the trimming operation to reduce offset.

In another aspect of the present invention, the offset detector includes an analog-to-digital converter, a microcontroller and a trim register. During a trimming operation, an amplifier output terminal is connected to the analog-to-digital converter, which then detects whether the amplifier output is a logic high or a logic low level. The microcontroller then uses this information to adjust a bit in the trim register corresponding to a bit of the binary-weighted control signal provided to the trim circuit. This process is performed iteratively until all of the bits of the control signal are determined. For example, in one embodiment, in the first cycle of the trimming operation, the microcontroller is programmed to determine the polarity of the offset and, thereby, which leg of the differential pair to enable a trim transistor (or transistors) so that the current will be increased in that leg. Then, the most significant bit of the trim register is set to one, thereby enabling the most heavily weighted (i.e., the largest sized) trim transistor of the set. In the next cycle, the analog-to-digital converter detects whether the amplifier output signal reverses polarity from the first cycle. More particularly, if the polarity reverses, enabling the most significant bit of the control signal caused the polarity of the offset to reverse. In this case, the most significant bit of the trim register is set to zero and saved. If the polarity of the amplifier's output signal does not reverse, then the most significant bit of the trim register is set to one and saved. Similarly, in the next cycle, the next most significant bit is set to one (thereby enabling the next most heavily-weighted trim transistor) and the analog-to-digital converter detects whether the amplifier output signal reverses polarity. Depending on this outcome, the corresponding bit of the trim register is set to zero or one and saved. This process is repeated until all of the bits of the control signal are tested.

In yet another aspect of the present invention, the offset detector is implemented with a successive approximation circuit instead of an analog-to-digital converter and microcontroller.

DETAILED DESCRIPTION

Figure 1:
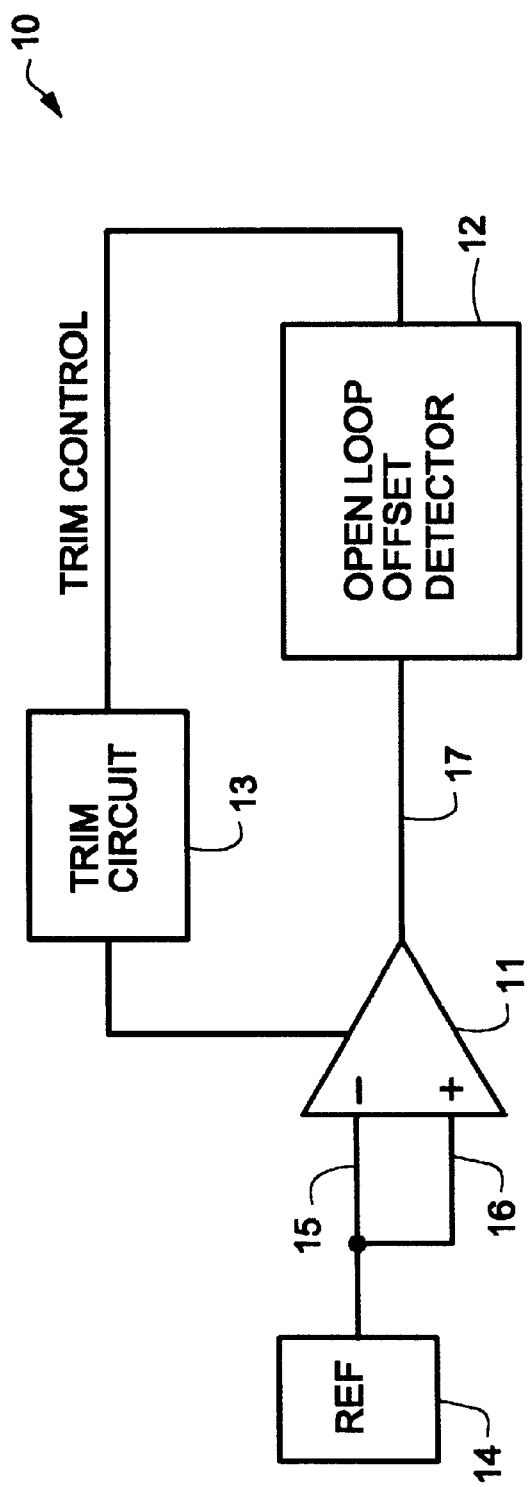
FIG. 1 is a block diagram illustrating an open loop offset adjustment system for a differential amplifier, according to one embodiment of the present invention.

FIG. 1 illustrates an open loop offset adjustment system 10 for a differential amplifier 11, according to one embodiment of the present invention. In this embodiment, open loop offset adjustment system 10 includes an open loop offset detector 12 (also referred to herein as offset detector 12), a trim circuit 13, and a reference generator 14. In this embodiment, differential amplifier 11 includes a differential pair for receiving a differential input signal via input lines 15 and 16. Reference generator 14 can be any standard reference generator. In this embodiment, reference generator 14 is implemented with a bandgap voltage reference, although other types of reference generators may be used in other embodiments.

During a trimming operation, open loop offset adjustment system 10 is interconnected to differential amplifier 11 as follows. Reference generator 14 is connected to the differential input terminals of differential amplifier 11 through lines 15 and 16 and, more specifically, provides the same reference signal to lines 15 and 16. An output terminal of differential amplifier 11 is connected to an input terminal of open loop offset detector 12 via a line 17. Open loop offset detector 12 provides a trim control signal to trim circuitry 13, which is connected to differential amplifier 11 as described below in conjunction with FIG. 2.

In view of the present disclosure, those skilled in the art of amplifier circuits will appreciate that during normal operation: (1) the differential input terminals are connected to receive a differential input signal (not shown) rather than the reference signal from reference generator 14; and (2) the output terminal of differential amplifier is connected to an output line (not shown) rather than to open loop offset detector 12. Conversely, during normal operation, trim circuit 13 remains connected to differential amplifier 11 having been configured during a trimming operation to reduce input offset in differential amplifier 11. Reconfiguring the amplifier circuit between trimming operation and normal operation is performed using standard switching circuitry, which is omitted for clarity. In light of the present disclosure and without undue experimentation, those skilled in the art of amplifier circuits can implement a large number of switching circuits suitable to reconfigure the amplifier circuit between trimming operation and normal operation.

Open loop offset adjustment system 10, in basic form, operates as follows. During a trimming operation, differential amplifier 11 is placed in an open loop configuration, with both input terminals connected to receive a common reference signal from reference generator 14. If differential amplifier 11 has an offset, the differential amplifier's output signal will essentially rail to either the supply voltage level or the ground level. In response to the logic level of the differential amplifier's output signal, offset detector 12 provides trim control signal to trim circuit 13 to adjust the current conducted by one leg of the differential pair of differential amplifier 11. More specifically, trim circuit 13 adjusts the current of one leg to reduce current mismatch in the legs of the differential pair, thereby reducing the offset.

Then, during normal operation, differential amplifier 11 is isolated from offset detector 12 and trim circuit 13, and the input terminals of differential amplifier 11 are connected to receive an input signal instead of the reference signal from reference generator 14. Because the trimming operation matched the "leg" currents of the differential pair of differential amplifier 11, the offset is reduced without the use of an autozeroing capacitor and without the need for analog-to-digital conversion of the amplifier output during normal operation. Further, this open loop system advantageously allows the trimming circuitry to be isolated from the gain network (not shown) of differential amplifier 11. In contrast, the previously described conventional solutions are performed closed loop, which tends to place the trimming circuitry in the gain network of the amplifier, which in turn can cause inaccuracy in the gain.

Figure 2:
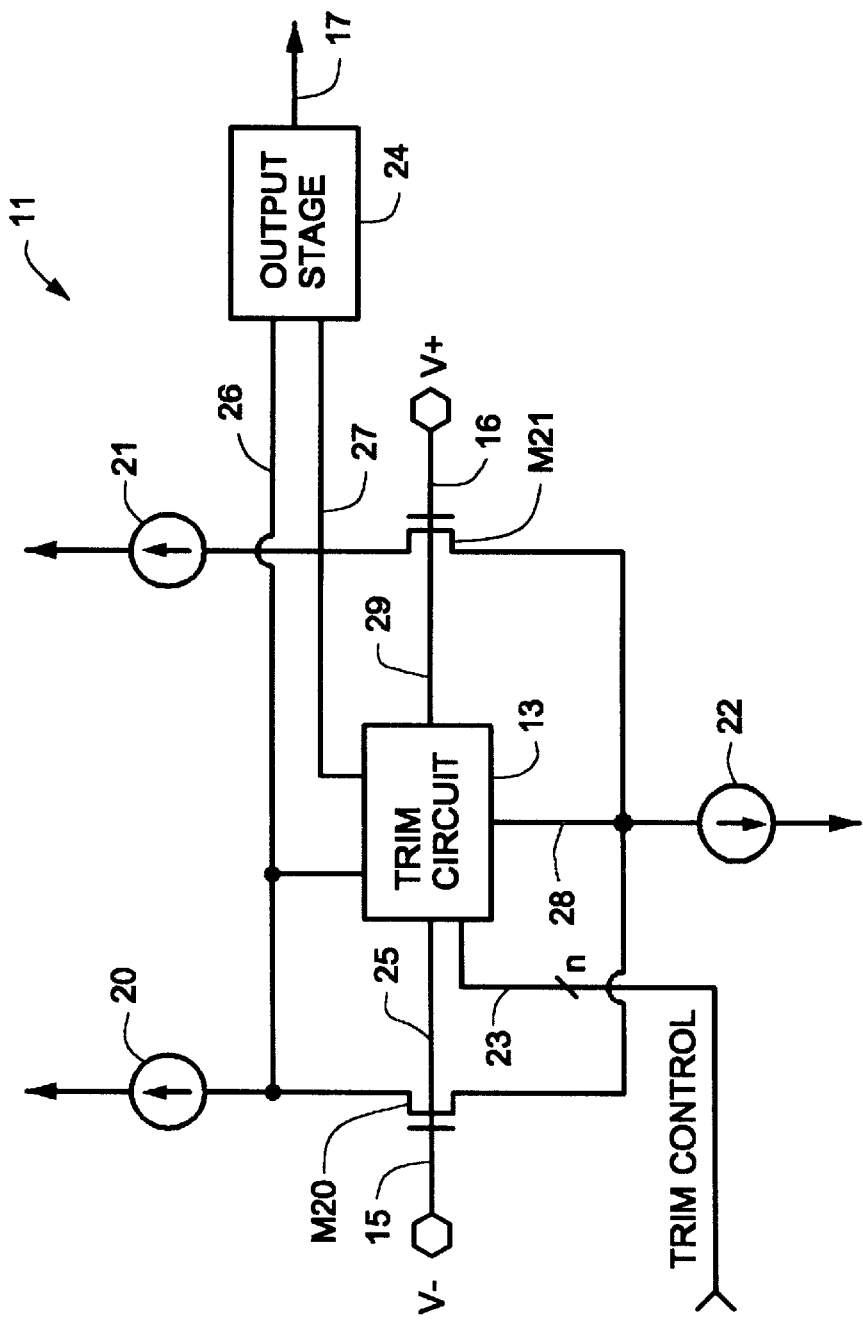
FIG. 2 is a circuit diagram illustrating the interconnection of a trim circuit of an open loop offset adjustment system to an exemplary differential amplifier, according to one embodiment of the present invention.

FIG. 2 is a circuit diagram illustrating the interconnection of trim circuit 13 of an open loop offset adjustment system 10 (FIG. 1) to an exemplary differential amplifier 11, according to one embodiment of the present invention. In this embodiment, differential amplifier 11 includes current sources 20, 21 and 22, N-channel transistors M20 and M21, and an output stage 24. In one embodiment, output stage 24 is implemented using a folded cascode output stage. In light of the present disclosure, those skilled in the art will appreciate that trim circuit 13 can be used with different implementations of differential amplifier 11 that include a differential pair for receiving a differential input signal.

The elements of differential amplifier 11 are interconnected as follows. In this embodiment, the differential pair of differential amplifier 11 is implemented with two N-channel transistors M20 and M21, connected in a common source configuration. The drains of N-channel transistors M20 and M21 are connected to output stage 24 and to resistor or transistor loads 20 and 21, respectively. The common source of N-channel transistors M20 and M21 are connected to current source 22. The gate of N-channel transistor M20 is connected to receive the V-component of the differential input signal through line 15. The gate of N-channel transistor M21 is connected to receive the V+ component of the differential input signal through line 16. Trim circuit 13 is connected to receive the trim control signal via a line 23 from offset detector 12 (FIG. 1). In this embodiment, the trim control signal is an n-bit control signal. In addition, trim circuit 13 is connected in parallel with N-channel transistors M20 and M21. More particularly, trim circuit 13 is connected to (a) the drains of N-channel transistors M20 and M21 through lines 26 and 27, respectively; (b) the common source of N-channel transistors M20 and M21 through a line 28, and (c) the gates of N-channel transistors M20 and M21 through lines 25 and 29, respectively. In this embodiment, trim circuit 13, in response to the trim control signal received via line 23, selectively conducts current from either load 20 or load 21 so that the currents provided by current sources 20 and 21 more closely match, thereby reducing offset. One particular embodiment of trim circuit 13 is described below in conjunction with FIG. 4.

Figure 3:
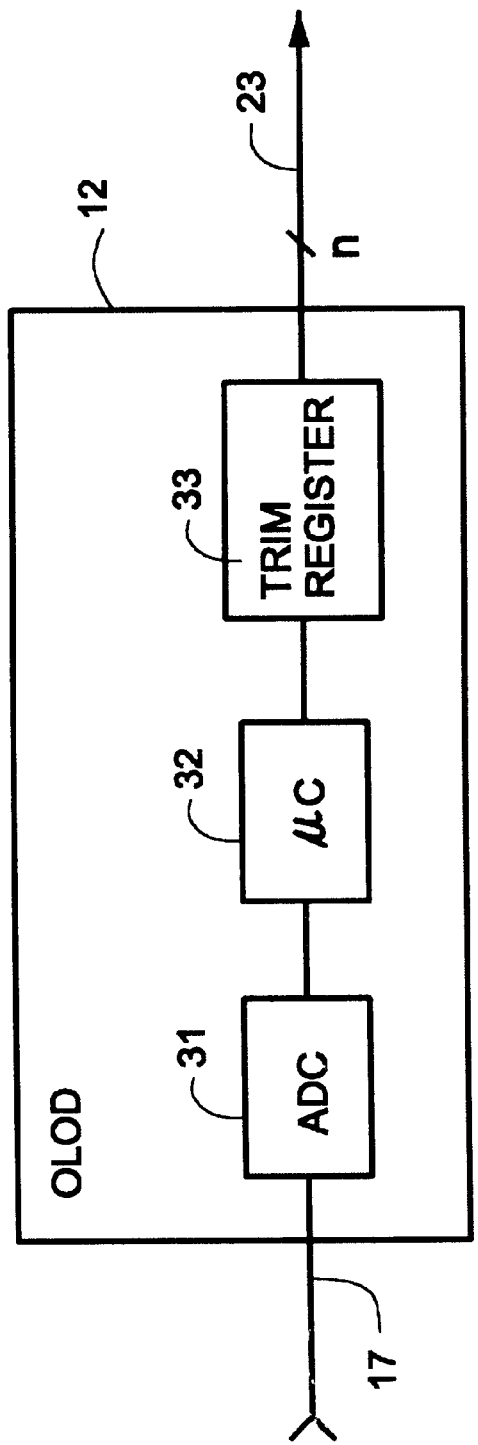
FIG. 3 is a block diagram illustrating an exemplary offset detection circuit for use in an open loop offset adjustment system, according to one embodiment of the present invention.

FIG. 3 illustrates offset detector 12 (FIG. 1), according to one embodiment of the present invention. In this embodiment, offset detector 12 includes an analog-to-digital converter (ADC) 31, a microcontroller circuit 32, and a trim register 33. ADC 31 can be any suitable ADC implementation. In alternative implementations, ADC 31 can be implemented as a level shifter or other simple circuit that can detect the logic level of signal present on line 17. Microcontroller circuit 32 includes associated memory (not shown) to store software or firmware instructions and data for use by a microcontroller, microprocessor or other type of control circuit. Trim register 33, in one embodiment, is implemented as a standard register. In some embodiments, trim register 33 can have independently loadable bits. In light of the present disclosure, those skilled in the art of amplifier circuits will appreciate that offset detector also receives clock/timing signals needed to operate the ADC, microcontroller, and trim register, which are not germane to the invention and omitted for clarity. In light of the present disclosure, those skilled in the art can implement circuitry for generating such signals without undue experimentation.

The elements of this embodiment of offset detector 12 are interconnected as follows. ADC 31 is connected to line 17 to receive the output signal of differential amplifier 11 (FIG. 2) during trimming operations. Microcontroller circuit 32 is connected to receive the digital output signal of ADC 31. In addition, microcontroller circuit 32 is connected to provide an output signal to trim register 23, which in turn is connected to line 23 to provide the trim control signal to trim circuit 13 (FIG. 2). Microcontroller circuit 32 is programmed to measure the level of the output signal of differential amplifier 11 in response to a known input signal via ADC 31. From these measurements, microcontroller circuit 32 is programmed to determine, ultimately, the offset and to load a trim control signal into trim register 33 that configures trim circuit 13 (FIG. 2) to reduce this offset. In one embodiment, microprocessor circuit 32 determines this offset by detecting whether the level of the amplifier output signal is either at the supply level or ground level. This process is described in more detail below in conjunction with FIG. 5.

In a further refinement, offset detector 12 may also include non-volatile memory (not shown) to store the value of trim register 33 so that in the event power is interrupted, a trimming operation need not be performed. Instead, trim register 33 may be reloaded with the value stored in the non-volatile memory.

Figure 4:
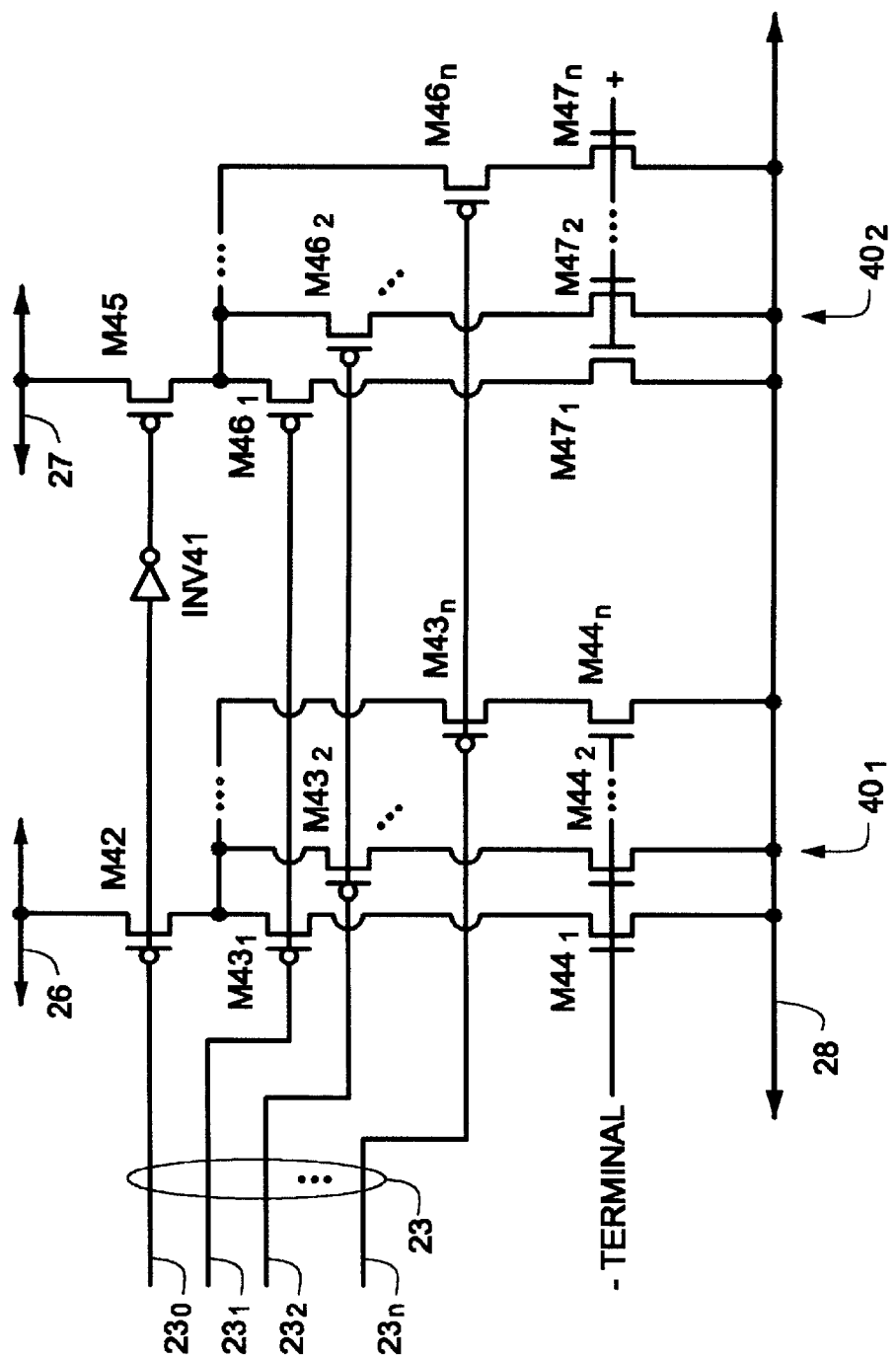
FIG. 4 is a circuit diagram illustrating an exemplary trim circuit for use in an open loop offset adjustment system, according to one embodiment of the present invention.

FIG. 4 illustrates an exemplary embodiment of the trim circuit 13 (FIG. 2), according to one embodiment of the present invention. In this embodiment, trim circuit 13 includes a first set of transistors $40_1$, a second set of transistors $40_2$ and an inverter INV41. The first set of transistors includes P-channel transistors M42 and M$43_1$–M$43_n$, and N-channel transistors M$44_1$–M$44_n$. The second set of transistors includes P-channel transistors M45 and M$46_1$–M$46_n$ and N-channel transistors M$47_1$–M$47_n$. In this embodiment, the control signal provided by offset detector 12 (FIG. 2) through line 23 has n+1 bits. That is, in this embodiment, line 23 is a bus that is n+1 bits wide, with individual lines $23_0$–$23_n$. Line $23_0$ carries a select signal that selects either first set of transistors $40_1$ or second set of transistors $40_2$. Lines $23_1$–$23_n$ carry signals that enable corresponding transistors of the first and second groups of transistors $40_1$ and $40_2$. In typical embodiments, n represents an integer ranging from one to eight. However, in light of the present disclosure, those skilled in the art of differential amplifiers will appreciate that n can represent any positive integer.

The elements of this embodiment of trim circuit 13 are interconnected as follows. N-channel transistors M$44_1$–M$44_n$ have their sources connected to line 28 and their gates are connected to receive signal V−. N-channel transistors M$47_1$–M$47_n$ also have their sources connected to line 28, but their gates are connected to receive signal V+. The drains of N-channel transistors M$44_1$–M$44_n$ and M$47_1$–M$47_n$ are connected to the drains of P-channel transistors M$43_1$–M$43_n$ and M$46_1$–M$46_n$, respectively. P-channel transistors M$43_1$–M$43_n$ have their gates connected to lines $23_1$–$23_n$, respectively. Similarly P-channel transistors M$46_1$ and M$46_n$ have their gates connect to lines $23_1$–$23_n$, respectively. The sources of P-channel transistors M$43_1$–M$43_n$ are connected to the drain of P-channel transistor M42. P-channel transistor M42 has its gate connected to line $23_0$ and has its source connected to line 26. Similarly, the sources of P-channel transistors M$46_1$–M$46_n$ are connected to the drain of P-channel transistor M45, which has its gate coupled to line $23_0$ through inverter INV41 and has its source connected to line 27. In this embodiment, the width-to-length ratio of N-channel transistor M$44_1$ is half that of N-channel transistor M$44_2$, which is half that of N-channel transistor M$44_3$ and so on. Similarly, the width-to-length ratio of N-channel transistor M$47_1$ is half that of N-channel transistor M$47_2$ and so on. In this way, the transistors sizes have a binary weighting and will be enabled according to the n-bit binary number provided on lines $23_1$–$23_n$. Of course, different weighting schemes can be used in other embodiments.

This embodiment of trim circuit 13 operates as follows. Offset detector 12 (FIG. 1) generates the n-bit control signal so that line $23_0$ carries the signal that selects either P-channel transistors M$43_1$–M$43_n$ or, via inverter INV4l, selects P channel transistors M$46_1$–M$46_n$. Offset detector 12 turns on a combination of P-channel transistors M$43_1$–M$43_n$ (or M$46_1$–M$46_n$) by appropriate signals on lines $23_1$–$23_n$. For example, if the signal on line $23_0$ is at a logic low level, then P-channel transistor M42 is turned on, thereby selecting the first set of transistors $40_1$ (i.e., M$43_1$–M$43_n$ and M$44_1$–M$44_n$). The control signals on lines $23_1$–$23_n$ then selectively turn on P-channel transistors $M43_1$–$M43_n$ so that, in combination with corresponding N-channel transistors $M44_1$–$M44_n$, the enabled transistors form, in effect, a single composite transistor with transistor M20 (FIG. 2). In effect, P-channel transistors $M43_1$–$M43_n$ act as switches selecting the N-channel transistors $M44_1$–$M44_n$ and putting the selected transistors in parallel with the input N-channel transistor M20. In one embodiment, the sizes of the switch P-channel transistors $M43_1$–$M43_n$ have binary weighting as well as N-channel transistors $M44_1$–$M44_n$, although in other embodiments the switch transistors need not be so weighted. As previously described, the size of this composite transistor affects the offset of the differential amplifier. By appropriately selecting which transistors are turned on, offset detector 12 can significantly reduce offset. For example, to compensate for a relatively large offset, most or all of P-channel transistors $M43_1$–$M43_n$ would be enabled. For a relatively small offset, perhaps only P-channel transistors $M43_1$ or $M43_2$ would be enabled.

In another embodiment, a single set of trim transistors can be used with appropriate multiplexers/switching circuitry to connect the set of trim transistors in parallel with one or the other of the input transistors of the differential pair. Further, in light of this description, those skilled in the art of differential amplifiers will appreciate that trim circuit 13 can be implemented in substantially the same manner, with the exception that power buses and the conductivities of the field effect transistors would be interchanged, and the trim control signal on lines $23_0$–$23_n$ would be complemented.

Figure 5:
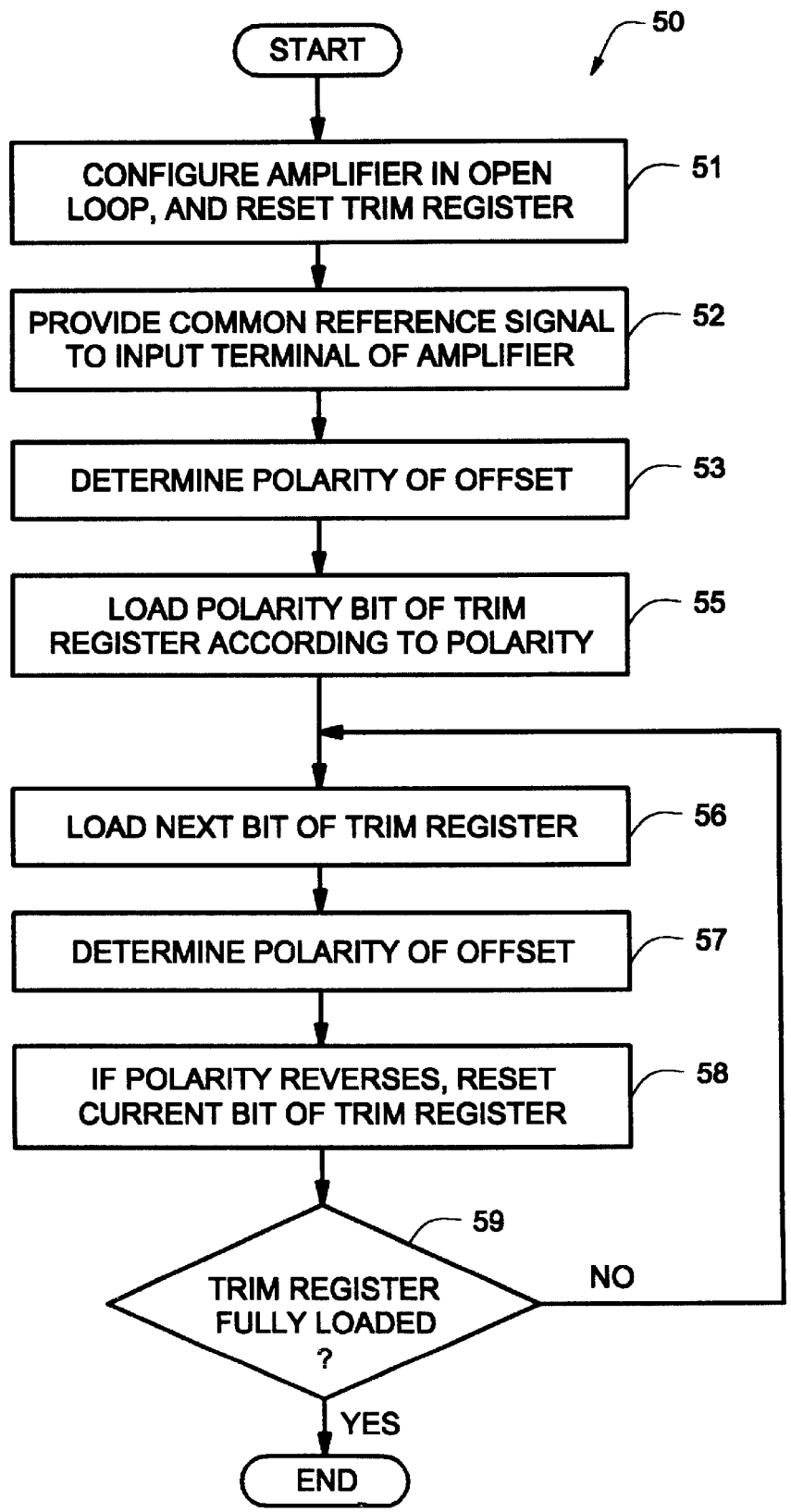
FIG. 5 is a flow diagram illustrating the operation of an open loop offset adjustment system, according to one embodiment of the present invention.

FIG. 5 illustrates a flow diagram of a trimming operation 50 of open loop offset adjustment system 10, according to one embodiment of the present invention. Referring to FIGS. 1, 3 and 4, this embodiment of open loop offset adjustment system 10 performs trimming operation 50 as follows. Trimming operation 50 begins with a block 51 in which differential amplifier 11 is configured in an open loop configuration, and trim circuit 13 is reset so that all of its trim transistors (see FIG. 4) are disabled. In one embodiment, differential amplifier 11 is placed in an open loop configuration by disabling or disconnecting differential amplifier 11 from the gain network (not shown) and by connecting the differential amplifier's input and output terminals to reference generator 14 and offset detector 12, respectively.

In a next block 52, the trimming operation provides a common input signal to the differential input terminals of differential amplifier 11. In this exemplary embodiment, reference generator 14 provides a reference voltage to the input terminals of differential amplifier 11 via lines 15 and 16. Because of the open loop configuration, any offset in differential amplifier 11 will cause the output signal of differential amplifier 11 to rail to either the power supply voltage level (or slightly below in magnitude) or the ground level (or slightly above in magnitude), depending on the polarity of the offset. If differential amplifier 11 is perfectly matched (i.e., has no offset), the output signal of differential amplifier will be at a level that is between the power supply voltage and the ground voltage (e.g., a midpoint or possibly one that is equal to the voltage differential multiplied by the open loop gain of differential amplifier 11). However, a perfectly matched differential amplifier is very rare and, further, noise in the circuitry will likely cause the amplifier to rail the output signal.

In this embodiment, trimming operation 50 then determines the polarity of the offset in a block 53. For example, if the output signal of differential amplifier 11 rails to the supply voltage level, then the polarity of the offset is positive. For example, in one embodiment, this block can be performed by microcontroller circuit 32 detecting the logic state of the MSB of the output signal of ADC 31.

In a next block 55, trimming operation 50 loads the polarity bit (i.e., the bit on line $23_0$ in FIG. 4) as a function of the polarity determined in block 54. For example, in one embodiment, microcontroller circuit 32 would load the bit in trim register 33 that is connected to drive line $23_0$. Continuing the example of block 53, because the offset is positive, the polarity bit is loaded with a logic high level, thereby selecting the second set of trim transistors $40_2$.

In a block 56, the next bit is set, (starting with the most significant bit of trim register 33 and then the next most significant, and so on) and is now denoted the current bit. More specifically, in this exemplary embodiment, the most significant bit of trim register 33 is connected to line $23_n$, and the next most significant bit of trim register 33 is connected to line $23_{n-1}$, and so on. In this example, setting a bit of trim register 33 causes the corresponding bit of the trim control signal to be at a logic low level, which is turn enables the associated trim transistor. Enabling the trim transistor results in the "V+" leg of differential amplifier 11 conducting more current.

In a block 57, trim operation 50 again determines the polarity of the offset of differential amplifier 11. This block can be performed in the same manner as block 53 described above.

In a block 58, trim operation 50 resets the current bit if the polarity as determined in block 57 reverses as compared to the polarity detected in block 53. That is, the polarity reversal indicates that the leg of differential amplifier 11 now conducts too much current and, thus, the enabled trim transistor should now be disabled. In contrast, if the polarity does not reverse, the leg of differential amplifier 11 still does not conduct enough current and the current bit should remain set.

In a block 59, trimming operation 50 determines whether trim register 33 has been completely loaded. If so, trimming operation 50 ends. Otherwise, trimming operation 50 loops back to perform block 56 again. This process is repeated until trim register 33 is completely loaded. In one embodiment, this looping process is performed using standard loop counter techniques. The counter variable can also be used select the current bit in trim counter 33.

Figure 6:
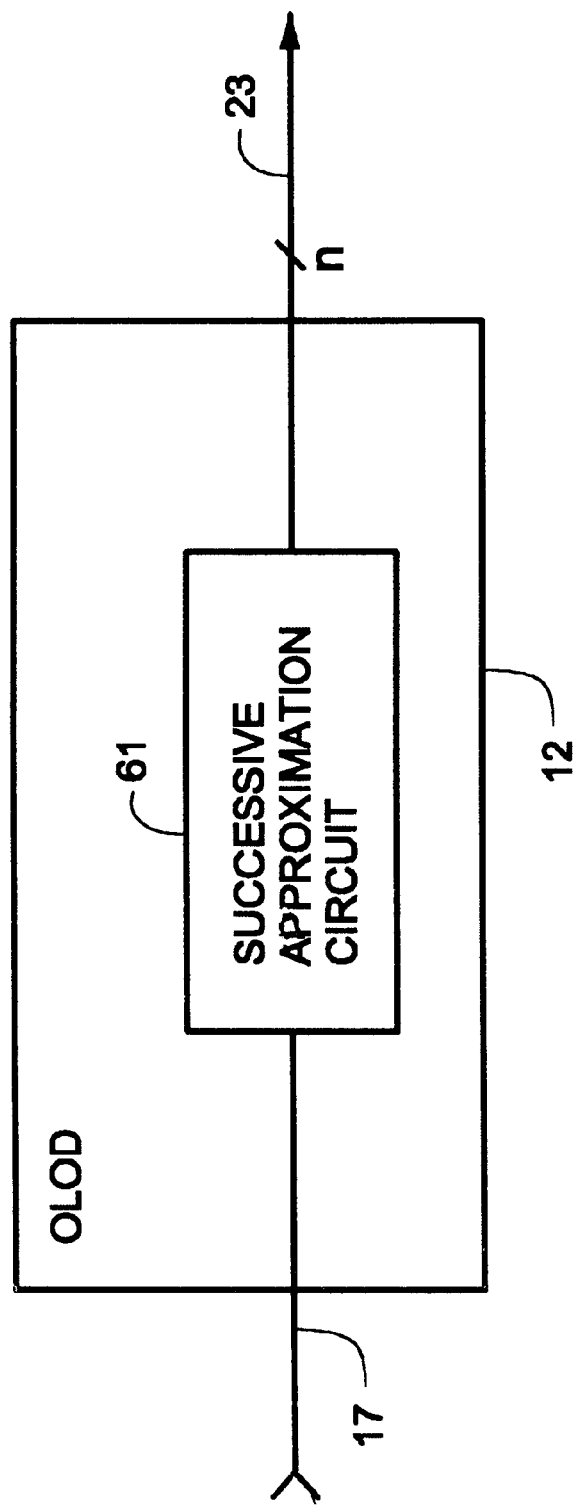
FIG. 6 is a block diagram illustrating an exemplary offset detection circuit for use in an open loop offset adjustment system, according to another embodiment of the present invention.
Figure 6A:
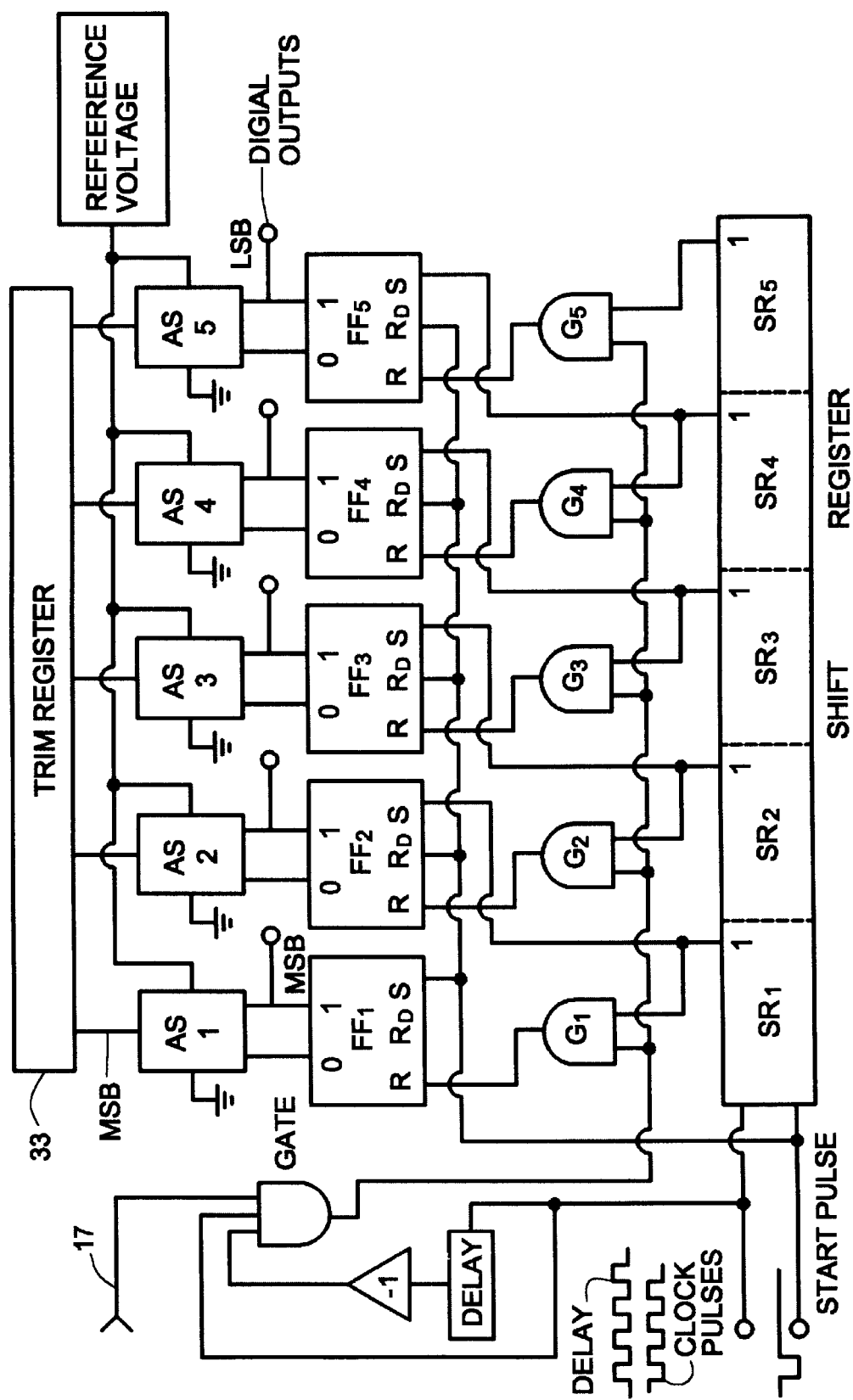
FIG. 6A is a circuit diagram of a successive approximation circuit, according to one embodiment of the present invention.

FIG. 6 illustrates an offset detection circuit 12, according to an alternative embodiment of the present invention. This embodiment of offset detection circuit 12 includes a successive approximation circuit 61. Basically, successive approximation circuit 61 implements in circuitry the methodology described above in conjunction with the flow diagram of FIG. 5. One example is shown in FIG. 6A, which is similar to a successive approximation circuit described in "A User's handbook of D/A and A/D Converters" by E. R. Hnatek, (1976). In other embodiments, in light of the present disclosure, those skilled in the art can implement in logic circuitry a finite state machine or a serial decoder that maps each possible sequence of comparisons into a n-bit trim control signal to be stored in a register.

Figure 7:
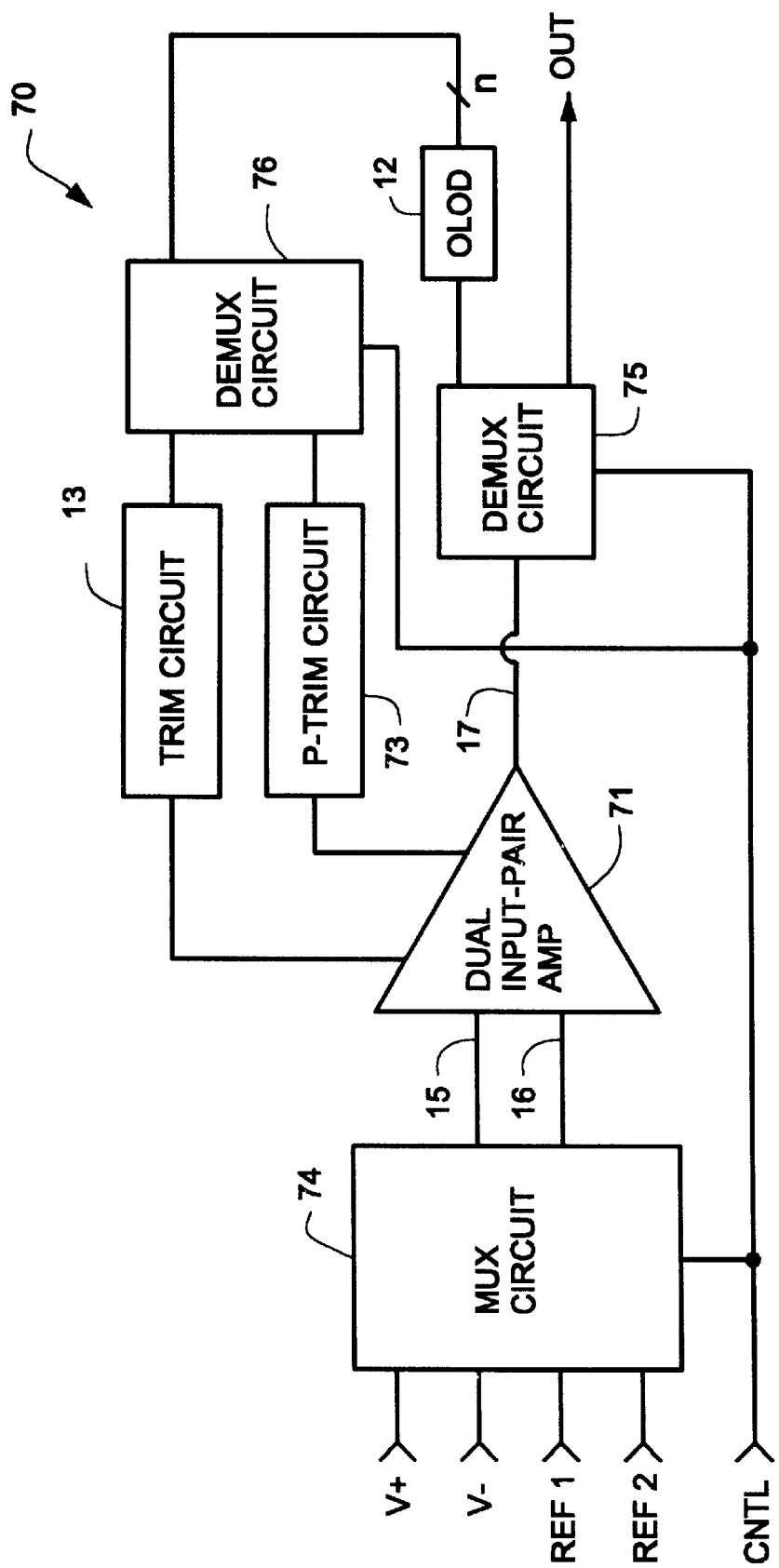
FIG. 7 is a circuit diagram illustrating an open loop offset adjustment system for a dual input pair differential amplifier, according to another embodiment of the present invention.

FIG. 7 illustrates an open loop offset adjustment system 70 for a dual input pair differential amplifier 71, according to another embodiment of the present invention. Differential amplifier 71 includes an N-channel differential pair as in FIG. 2 and, in addition, a P-channel differential pair. This design allows differential amplifier 71 to handle rail-to-rail input signals. Open loop offset adjustment system 70 is similar to open loop offset adjustment system 10 (FIG. 1)

except for the addition of a P-trim circuit 73 and the addition of another trim register (not shown) in offset detector 12 associated with P-trim circuit 73. P-trim circuit 73 is similar to trim circuit 13 (FIG. 4), but having P-channel trim transistors. One embodiment of P-trim circuit 73 is described below in conjunction with FIG. 8. In addition, FIG. 7 shows some switching circuitry that was omitted in FIG. 1 used in reconfiguring the amplifier circuit between trimming operation and normal operation. However, the gain network is still omitted for clarity. This switching circuitry includes a multiplexer circuit 74 and demultiplexer circuits 75 and 76. In light of the present disclosure, those skilled in the art of amplifier circuits can implement the switching circuitry in several alternative ways without undue experimentation.

In this embodiment, open loop offset trimming system 70 performs a separate trimming operation for each differential pair of differential amplifier 71. In a trimming operation, multiplexer circuit 74 and demultiplexer circuits 75 and 76 operate to: (a) place differential amplifier 71 into an open loop configuration; (b) provide either reference signal REF1 or REF2 (depending on which differential pair is being trimmed) to lines 15 and 15; (c) connect line 17 (i.e., the output signal of differential amplifier 71) to offset detector 12; and (d) connect the output lines of offset detector 12 to either trim circuit 13 or P-trim circuit 73 (depending on which differential pair is being trimmed). In one embodiment, reference signal REF1 is set to be within a threshold voltage of the supply voltage level whereas reference signal REF2 is set to be within a threshold voltage of the ground voltage level. Reference signal REF1 is used for trimming the N-channel differential pair, thereby helping to ensure that the P-channel differential pair will not conduct. Similarly, reference signal REF2 is used for trimming the P-channel differential pair to help ensure that the N-channel differential pair will not conduct. Each differential pair of differential amplifier 71 is then trimmed as described above.

Figure 8:
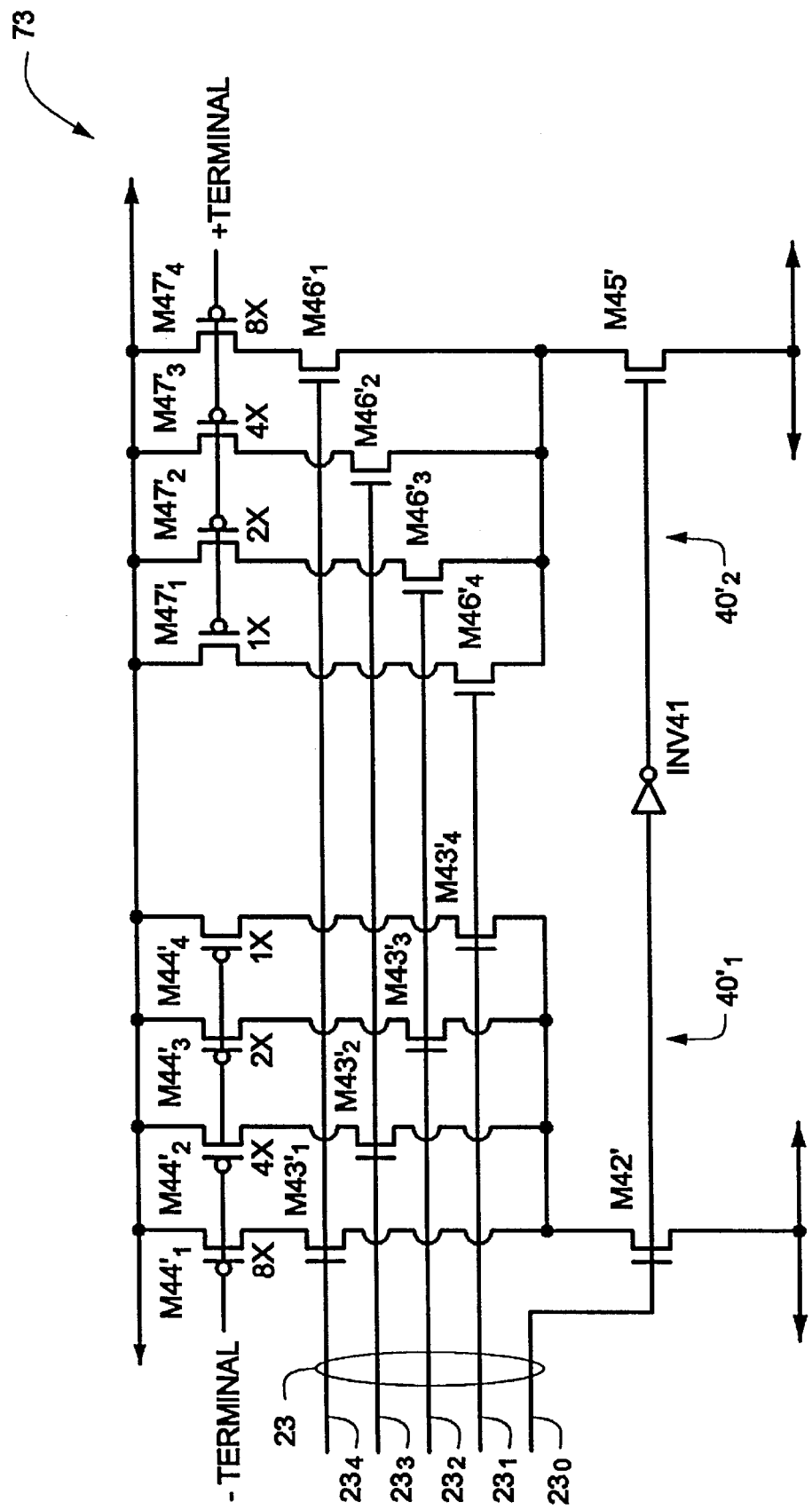
FIG. 8 is a circuit diagram illustrating an exemplary trim circuit for use in adjusting the offset of a P-channel differential pair, according to one embodiment of the present invention.

FIG. 8 illustrates P-trim circuit 73 (FIG. 7), according to one embodiment of the present invention. In this embodiment, P-trim circuit 73 is substantially similar to trim circuit 13 (FIG. 4), except that the conductivities of the field effect transistors are reversed. In FIG. 8, this reversal is indicated by a prime symbol, e.g., transistor $M44_1'$ is a P-channel device whereas transistor $M44_1$ (FIG. 4) is an N-channel device). Further, in this embodiment, n is set to four. P-trim circuit 73 operates in substantially the same manner as trim circuit 13 (FIG. 4), except that the trim control signals on lines $23_0$–$23_n$ are complemented as compared to that in trim circuit 13.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A circuit for adjusting input offset in a differential amplifier having a differential pair circuit having a plurality of input transistors and a plurality of current paths associated with the plurality of input transistors, circuit method comprising:

a reference generator coupled to the differential amplifier;

a trim circuit selectively coupled to the differential amplifier, wherein the trim amplifier in response to a trim control signal during an offset adjustment mode, the trim circuit being decoupled from the differential amplifier when the differential amplifier is in a mode that is different from the offset adjustment mode; and an open loop offset detector coupled to the trim circuit and selectively coupled to the differential amplifier, the open loop offset detector being configured to provide the trim control signal responsive to an input offset in the differential amplifier, the open loop offset detector being coupled to the differential amplifier during the offset adjustment mode, the open loop offset detector being decoupled from the differential amplifier when the differential amplifier in a mode that is different from the offset adjustment mode.

2. The circuit of claim 1, wherein the open loop offset detector comprises an analog-to-digital converter, a controller circuit coupled to the analog-to-digital converter, and at least one trim register coupled to the controller circuit, the trim register being configurable to store information to be included in the trim control signal.

3. The circuit of claim 2, wherein the open loop offset detector further comprises non-volatile memory configured to store information stored in the trim register.

4. The circuit of claim 2, wherein the controller circuit is programmed to iteratively determine information to be contained in the trim control signal to adjust the input offset to a desired level and to store this information in the trim register.

5. The circuit of claim 1, wherein the trim circuit comprises a plurality of trim transistors, wherein one or more trim transistors of the plurality of trim transistors are configured to be selectively coupled in parallel with an input transistor of the differential amplifier.

6. The circuit of claim 5, wherein the plurality of trim transistors include a set of trim transistors that have sizes that are binarily weighted, the set being couplable to one input transistor of the plurality of input transistors of the differential amplifier.

7. The circuit of claim 6, wherein the plurality of trim transistors include another set of trim transistors that have sizes that are binarily weighted that are couplable to another input transistor of the plurality of input transistors of the differential amplifier.

8. The circuit of claim 1, wherein the differential pair circuit has one differential pair.

9. The circuit of claim 1, wherein the differential pair circuit comprises an N-channel differential pair and a P-channel differential pair.

10. The circuit of claim 1, wherein the open loop offset detector comprises a successive approximation circuit.

11. A circuit for adjusting input offset in a differential amplifier having a differential pair circuit having a plurality of input transistors and a plurality of current paths associated with the plurality of input transistors, circuit method comprising:

reference generator means, coupled to the differential amplifier, for providing one or more reference signals;

trim means, selectively coupled to the differential amplifier, for adjusting a current conducted in one of the current paths of the differential amplifier in response to a trim control signal during an offset adjustment mode, the trim circuit means being decoupled from the differential amplifier when the differential amplifier is in a mode that is different from the offset adjustment mode; and open loop offset detector means, coupled to the trim circuit and selectively coupled to the differential amplifier, for providing the trim control signal with information depending on an input offset of the differential amplifier, the open loop offset detector means being coupled to the differential amplifier during the offset adjustment mode, the open loop offset detector means being decoupled from the differential amplifier when the differential amplifier is in a mode that is different from the offset adjustment mode.

12. The circuit of claim 11, wherein the open loop offset detector means comprises an analog-to-digital converter, a controller circuit coupled to the analog-to-digital converter, and at least one trim register coupled to the controller circuit, the trim register being configurable to store information to be included in the trim control signal.

13. The circuit of claim 12, wherein the open loop offset detector means further comprises non-volatile memory configured to store information that is stored in the trim register.

14. The circuit of claim 12, wherein the controller circuit is programmed to iteratively determine information to be contained in the trim control signal to adjust the input offset to a desired level and to store this information in the trim register.

15. The circuit of claim 13, wherein the trim means comprises a plurality of trim transistors, wherein one or more trim transistors of the plurality of trim transistors are configured to be selectively coupled in parallel with an input transistor of the differential amplifier.

16. The circuit of claim 15, wherein the plurality of trim transistors include a set of trim transistors that have sizes that are binarily weighted, the set being couplable to one input transistor of the plurality of input transistors of the differential amplifier.

17. The circuit of claim 16, wherein the plurality of trim transistors include another set of trim transistors that have sizes that are binarily weighted that are couplable to another input transistor of the plurality of input transistors of the differential amplifier.

18. The circuit of claim 11, wherein the differential pair circuit has one differential pair.

19. The circuit of claim 11, wherein the differential pair circuit comprises an N-channel differential pair and a P-channel differential pair.

20. The circuit of claim 11, wherein the open loop offset detector means comprises a successive approximation circuit.

21. A method for adjusting an offset of a differential amplifier having a differential pair circuit having a plurality of input transistors and a plurality of current paths associated with the plurality of input transistors, the method comprising:
configuring the differential amplifier in open loop;
determining an offset of the differential amplifier;
providing a trim control signal containing information dependent on the determined offset; and
adjusting current conducted in one current path of the plurality of current paths of the differential amplifier in response to the trim control signal, wherein adjusting current further comprises performing actions, including:

(a) providing a common reference signal to input terminals of the differential amplifier;
(b) resetting a trim register;
(c) determining a polarity of the offset; and
(d) until the bits of the trim register associated with the trim control signal are all loaded, iteratively performing the actions of:
loading a next bit of the trim register, wherein the loaded next bit becomes the current bit,
providing the trim control signal with information loaded in the trim register,
adjusting current conducted in the one current path in response to the trim control signal,
determining a polarity of the offset resulting from the previously performed adjusting step, and
resetting the current bit of the trim register if the polarity of the offset reversed from the polarity determined for the offset.

22. An apparatus for adjusting an offset of a differential amplifier having a differential pair circuit having a plurality of input transistors and a plurality of current paths associated with the plurality of input transistors, the method comprising:
means for configuring the differential amplifier in open loop;
means for determining an offset of the differential amplifier;
means for providing a trim control signal containing information dependent on the determined offset; and
means for adjusting current conducted in one current path of the plurality of current paths of the differential amplifier in response to the trim control signal, wherein the means for adjusting current further comprises:
a trim register;
means for providing a common reference signal to input terminals of the differential amplifier;
means for resetting the trim register;
detection means for determining a polarity of the offset; and
means for iteratively loading the trim register, including:
means for loading a next bit of the trim register, wherein the loaded next bit becomes the current bit,
means for providing the trim control signal with information loaded in the trim register,
means for adjusting current conducted in the one current path in response to the trim control signal,
means for determining a polarity of the offset resulting from the previously performed adjusting step, and
means for resetting the current bit of the trim register if the polarity of the offset reversed from the polarity determined by the detection means.

* * * * *

UNITED STATES PATENT AND TRADEMARK OFFICE
CERTIFICATE OF CORRECTION

PATENT NO.     : 6,573,783 B2
DATED          : June 3, 2003
INVENTOR(S)    : Gray It is certified that error appears in the above-identified patent and that said Letters Patent is hereby corrected as shown below:

<u>Column 10,</u>
Line 11, "amplifier in a mode" should read -- amplifier is in a mode --

Signed and Sealed this

Twenty-third Day of September, 2003

JAMES E. ROGAN
*Director of the United States Patent and Trademark Office*